United States Patent
Huang

(10) Patent No.: US 11,469,207 B2
(45) Date of Patent: Oct. 11, 2022

(54) MITIGATING THERMAL IMPACTS ON ADJACENT STACKED SEMICONDUCTOR DEVICES

(71) Applicant: Micron Technology, Inc., Boise, ID (US)

(72) Inventor: Sui Chi Huang, Taichung (TW)

(73) Assignee: Micron Technology, Inc., Boise, ID (US)

( * ) Notice: Subject to any disclaimer, the term of this patent is extended or adjusted under 35 U.S.C. 154(b) by 82 days.

(21) Appl. No.: 16/871,490

(22) Filed: May 11, 2020

(65) Prior Publication Data

US 2021/0351160 A1 Nov. 11, 2021

(51) Int. Cl.
*H01L 25/065* (2006.01)
*H01L 23/34* (2006.01)
*H01L 23/40* (2006.01)

(52) U.S. Cl.
CPC .......... *H01L 25/0652* (2013.01); *H01L 23/34* (2013.01); *H01L 23/4012* (2013.01); *H01L 2225/06589* (2013.01)

(58) Field of Classification Search
CPC ....... H01L 25/0652; H01L 2225/06589; H01L 23/34; H01L 23/4012
See application file for complete search history.

(56) References Cited

U.S. PATENT DOCUMENTS

| 10,121,766 B2 * | 11/2018 | Monroe | H01L 23/3675 |
| 2021/0151417 A1 * | 5/2021 | Strogies | H01L 23/48 |
| 2021/0320078 A1 * | 10/2021 | Zinn | H01L 25/0652 |

\* cited by examiner

*Primary Examiner* — Phat X Cao
(74) *Attorney, Agent, or Firm* — Perkins Coie LLP

(57) ABSTRACT

A semiconductor device assembly and associated methods are disclosed herein. The semiconductor device assembly includes (1) a substrate having a first side and a second side opposite the first side; (2) a first set of stacked semiconductor devices at the first side of the substrate; (3) a second set of stacked semiconductor devices adjacent to one side of the first set of stacked semiconductor devices; (4) a third set of stacked semiconductor devices adjacent to an opposite side of the first set of stacked semiconductor devices; and (5) a temperature adjusting component at the second side and aligned with the second set of stacked semiconductor devices. The temperature adjusting component is positioned to absorb the thermal energy and thereby thermally isolate the second set of stacked semiconductor devices from the first set of stacked semiconductor devices.

15 Claims, 10 Drawing Sheets

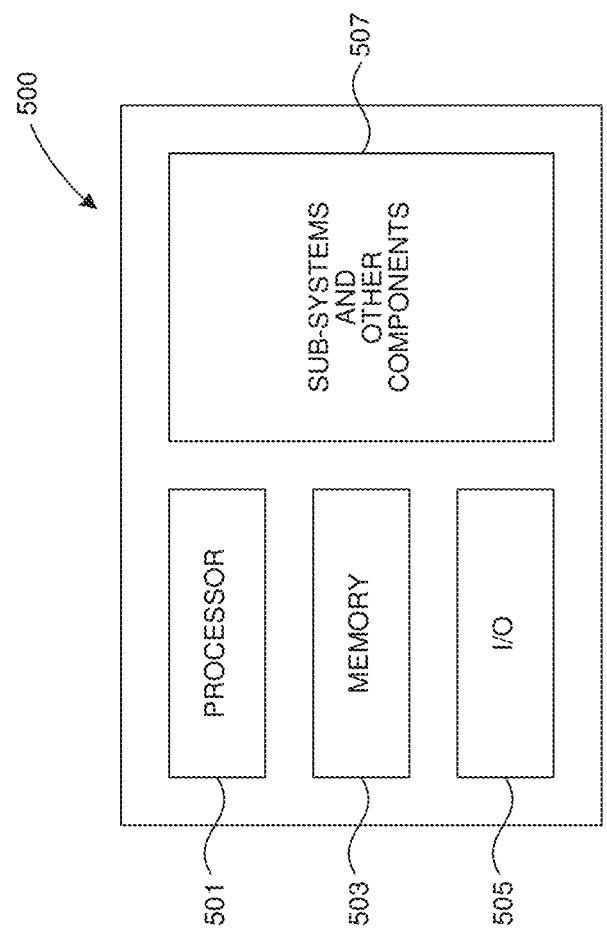

MITIGATING THERMAL IMPACTS ON ADJACENT STACKED SEMICONDUCTOR DEVICES

TECHNICAL FIELD

The present technology is directed to apparatus and methods for eliminating or at least mitigating the thermal impact of thermal processing on stacked semiconductor devices. More particularly, some embodiments of the present technology relate to apparatus and methods for mitigating thermal impacts on adjacent stacked semiconductor devices generated during thermal bonding processing.

BACKGROUND

Packaged and stacked semiconductor dies, including memory chips, microprocessor chips, logic chips and imager chips, typically include a semiconductor die mounted on a substrate and encased in a plastic protective covering. Individual semiconductor die can include functional features, such as memory cells, processor circuits, imager devices and other circuitry, as well as bond pads electrically connected to the functional features. Semiconductor manufacturers continually reduce the size of die packages to fit within the space constraints of electronic devices. One approach for increasing the processing power of a semiconductor package is to vertically stack multiple semiconductor dies on top of one another in a single package. Multiple semiconductor dies can be connected using a thermal bonding process that includes (i) positioning a film between two of these semiconductor dies and (ii) thermally curing the film.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

FIG. 5 is a block diagram illustrating a system that incorporates a semiconductor assembly in accordance with an embodiment of the present technology.

DETAILED DESCRIPTION

Specific details of several embodiments of stacked semiconductor die packages and methods of manufacturing such die packages are described below. The term "semiconductor device" generally refers to a solid-state device that includes one or more semiconductor materials. A semiconductor device can include, for example, a semiconductor substrate, wafer, or die that is singulated from a wafer or substrate. Throughout the disclosure, semiconductor dies are generally described in the context of semiconductor devices but are not limited thereto.

The term "semiconductor device package" can refer to an arrangement with one or more semiconductor devices incorporated into a common package. A semiconductor device package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly that includes multiple stacked semiconductor devices. As used herein, the terms "vertical," "lateral," "upper," and "lower" can refer to relative directions or positions of features in the semiconductor device or package in view of the orientation shown in the Figures. These terms, however, should be construed broadly to include semiconductor devices having other orientations, such as inverted or inclined orientations.

When using thermal energy to cure two adjacent semiconductor device packages that are close to each other, the thermal energy applied to a first package can adversely affect a second package. For example, excess thermal energy can further harden or otherwise impact a film of the second film such that it cannot properly deform to and/or adhere to connecting semiconductor dies. The present technology provides a solution to address this issue.

Figure 1A:
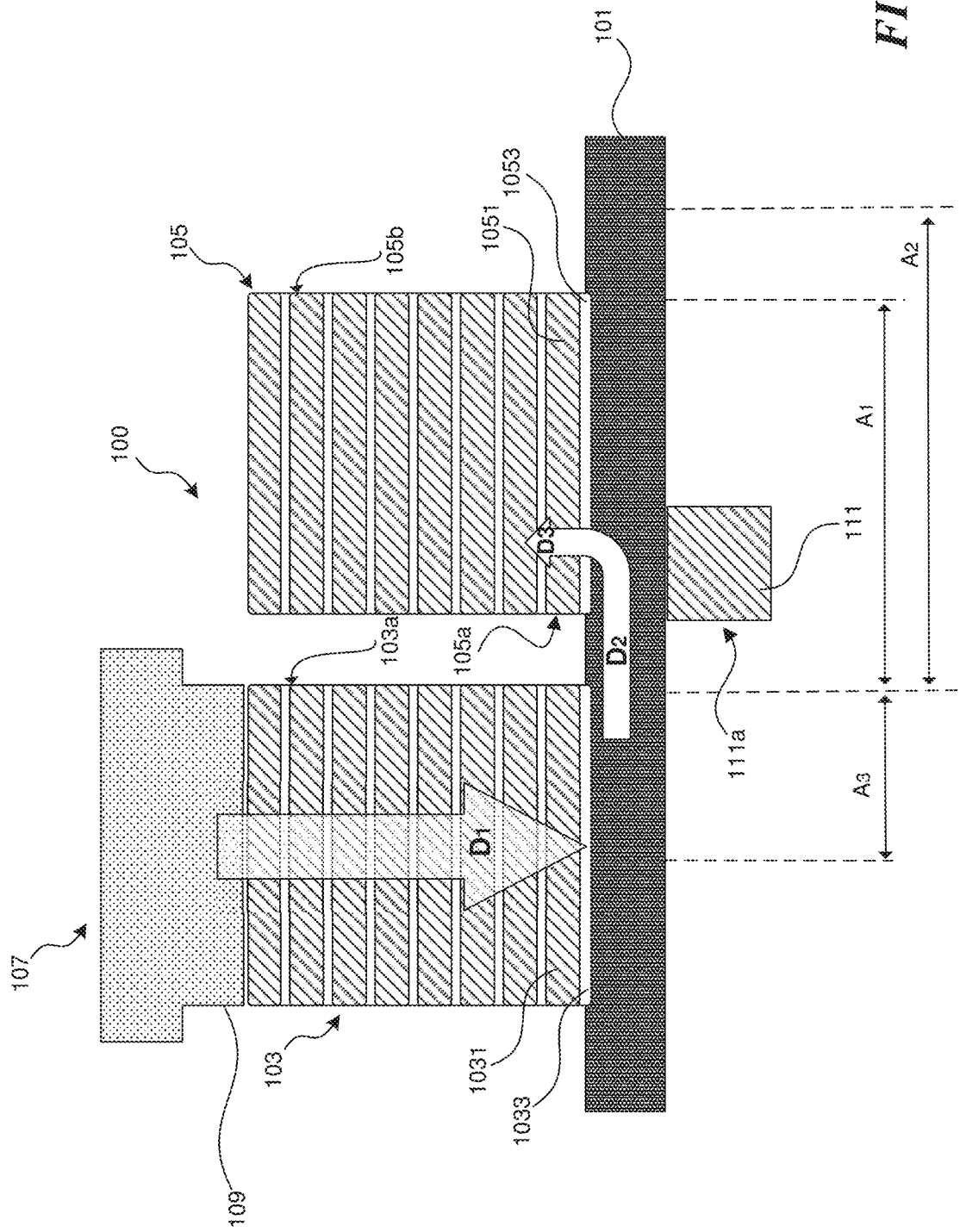
FIG. 1A is a schematic cross-sectional view of a semiconductor device assembly in accordance with an embodiment of the present technology.

FIG. 1A is a schematic cross-sectional view of a semiconductor device assembly 100 in accordance with an embodiment of the present technology. The semiconductor device assembly 100 includes a base substrate 101, a first set of stacked semiconductor devices 103, and a second set of stacked semiconductor devices 105. The first and second sets of semiconductor devices 103, 105 are adjacent to each other and carried by the base substrate 101. The semiconductor device assembly 100 can also include more than two semiconductor device packages. The first and second sets of stacked semiconductor devices 103, 105 are to be encapsulated or covered by suitable materials such as dielectric materials, epoxy resin, etc. The encapsulated first and second sets of stacked semiconductor devices 103, 105 can be named first and second semiconductor device packages, respectively.

The first set of stacked semiconductor devices 103 includes multiple semiconductor devices 1031 and multiple curable layers 1033 between or on the semiconductor devices 1031, respectively. In the embodiment illustrated in FIG. 1A, the first set of stacked semiconductor devices 103 includes eight semiconductor devices 1031 and eight curable layers 1033. However, it will be appreciated that the first set of stacked semiconductor devices 103 can have a different number of semiconductor devices 1031 and curable layers 1033.

The second set of stacked semiconductor devices 105 can also include multiple semiconductor devices 1051 and multiple curable layers 1053 between or on the semiconductor devices 1031, respectively. The embodiment of the second set of stacked semiconductor devices 105 shown in FIG. 1A has eight semiconductor devices 1051 and eight curable layers 1053, but the second set of stacked semiconductor devices 105 can include a different number of semiconductor devices 1051 and curable layers 1053 in other embodiments.

The curable layers 1033, 1053 can include a die-attaching material for bonding the semiconductor devices 1031, 1051 to one another or to the base substrate 101. The curable layers 1033, 1053 can be a non-conductive film (NCF), a non-conductive paste (NCP), etc. The curable layers 1033, 1053 can also include heat-sensitive or temperature-sensitive materials such that the stiffness or flexibility of the curable layers 1033, 1053 can be manipulated by adjusting the temperature or thermal energy.

The curable layers 1033 can be cured by applying thermal energy from a thermal component 109 of a bond head 107. In some embodiments, the thermal component 109 can be an external component that is attached to the bond head 107. As shown in FIG. 1A, the heat generated by the thermal component 109 flows through the first semiconductor die package 103 toward the base substrate 101 in direction $D_1$ and thereby cures the curable layers 1033. A portion of the thermal energy can also flow toward the second set of stacked semiconductor devices 105, as indicated by direction $D_2$, and then upward to one or more of the curable layers 1053, as indicated by direction $D_3$. This can adversely affect or more of the curable layers 1053.

The semiconductor device assembly 100 of the present technology can be manufactured by using a temperature adjusting component 111 configured to inhibit or prevent thermal energy generated by the thermal component 109 from reaching the curable layers 1053 of the second set of stacked semiconductor devices 105. The temperature adjusting component 111 is accordingly configured to at least partially thermally isolate the second set of stacked semiconductor devices 105 from the first set of stacked semiconductor devices 103. As shown in FIG. 1A, the temperature adjusting component 111 can be adjacent to the base substrate 101 and opposite to the second set of stacked semiconductor devices 105. The temperature adjusting component 111 can be in an area $A_1$ defined by a side 103a of the first set of stacked semiconductor devices 103 and a second side 105b of the second set of stacked semiconductor devices 105. For example, as shown in FIG. 1A, the temperature adjusting component 111 is positioned such that an edge 111a of the temperature adjusting component 111 is aligned with a first side 105a of the second set of stacked semiconductor devices 105. In some embodiments, the temperature adjusting component 111 can be shaped or formed to cover a substantial portion of area $A_1$. For example, the substantial portion can mean more than 90%, 75%, or 50% in various embodiments.

The temperature adjusting component 111 can also or alternatively be in an area $A_2$ and/or an Area $A_3$. When the temperature adjusting component 111 is in Area $A_2$, the temperature adjusting component 111 absorbs heat transferred through the base substrate 101 from both sides of the second set of stacked semiconductor devices 105. When the temperature adjusting component 111 is in Area $A_3$, the temperature adjusting component 111 directly absorbs excessive heat from directly underneath the first set of stacked semiconductor devices 103.

The temperature adjusting component 111 can be a cooling unit or a heat sink configured to absorb the thermal energy from the thermal component 109 to maintain the temperature of the base substrate 101 within a desired range. The temperature adjusting component 111, for example, can be a "passive" cooling unit that only absorbs heat energy transferred thereto and cools through conduction and convection to the environment. The temperature adjusting component 111 can alternatively be an "active" cooling unit that actively cools other components (e.g., the second set of stacked semiconductor devices 105). In such embodiments, the temperature adjusting component 111 can be a thermo-electric component, such as a thermoelectric cooler, a Peltier device, a solid-state refrigerator, etc.

Figure 1B:
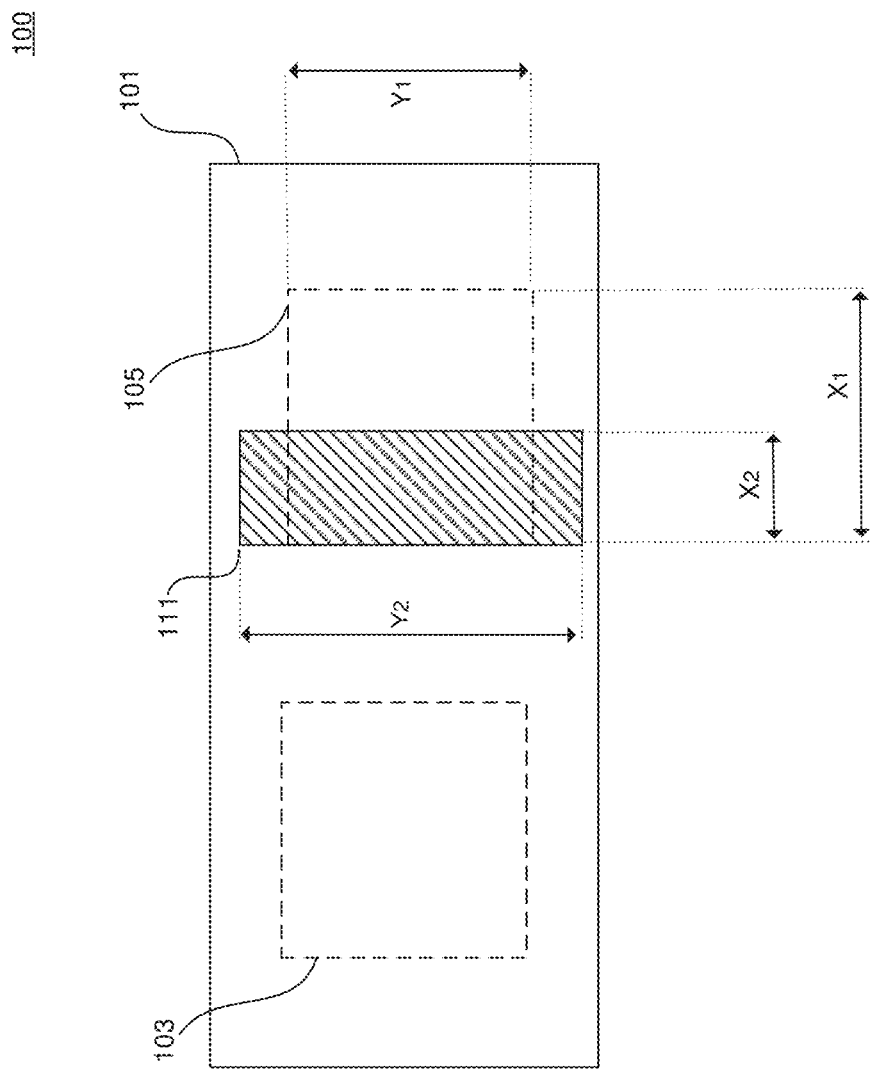
FIG. 1B is a schematic bottom view of a semiconductor device assembly in accordance with an embodiment of the present technology.

FIG. 1B a schematic bottom view of the semiconductor device assembly 100 shown in FIG. 1A. The second set of stacked semiconductor devices 105 has a first lateral dimension $X_1$ and a second lateral dimension $Y_1$. The first set of stacked semiconductor devices 103 has generally the same lateral dimensions as the second set of stacked semiconductor devices 105. The temperature adjusting component 111 has a first lateral dimension $X_2$ and a second lateral dimension $Y_2$. In the embodiment illustrated in FIG. 1B, the first lateral dimension $X_2$ of the temperature adjusting component 111 is smaller than the first lateral dimension $X_1$ of the second set of stacked semiconductor devices 105, whereas the second lateral dimension $Y_2$ of the temperature adjusting component 111 is greater than the second lateral dimension $Y_1$ of the second set of stacked semiconductor devices 105. The temperature adjusting component 111 can have a rectilinear shape, such as a square, a rectangle (shown in FIG. 1B), etc.

Figure 2A:
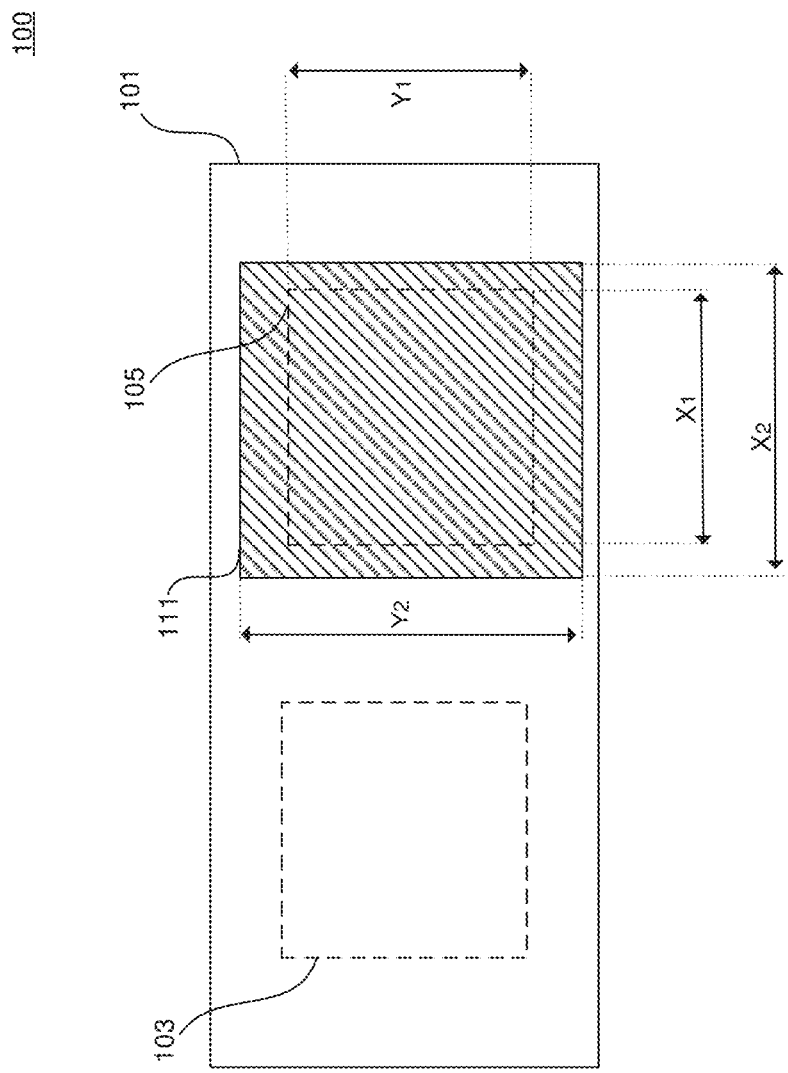
FIGS. 2A-2C are schematic bottom views of semiconductor device package assemblies in accordance with embodiments of the present technology.
Figure 2B:
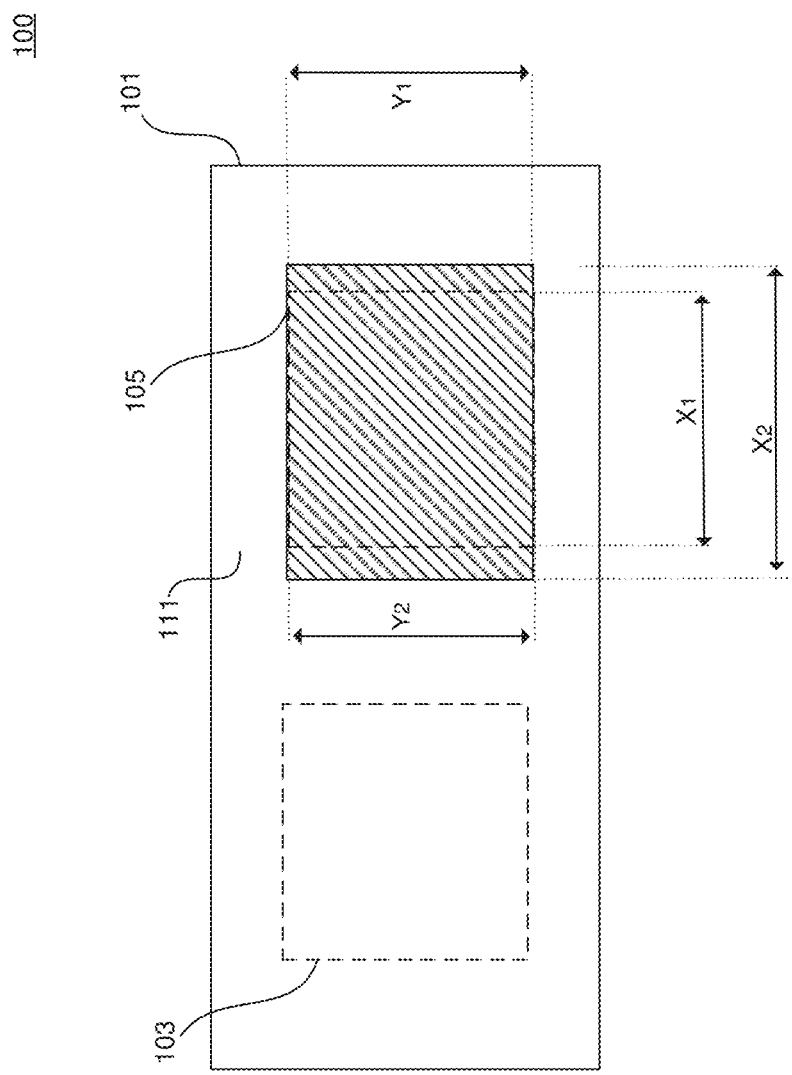
Figure 2C:
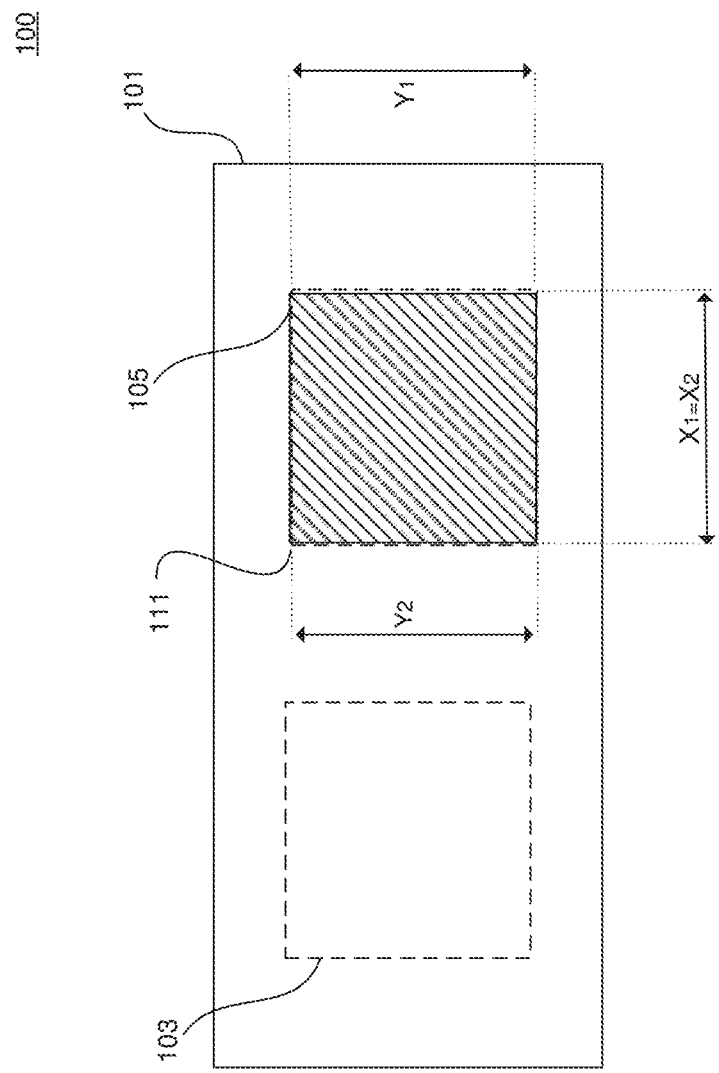

FIGS. 2A-2C are schematic bottom views of the semiconductor device package assemblies 100 in accordance with embodiments of the present technology. In the embodiment illustrated in FIG. 2A, the first lateral dimension $X_2$ of the temperature adjusting component 111 is greater than the first lateral dimension $X_1$ of the second set of stacked semiconductor devices 105, and the second lateral dimension $Y_2$ of the temperature adjusting component 111 is also greater than the second lateral dimension $Y_1$ of the second set of stacked semiconductor devices 105. In the embodiment illustrated in FIG. 2B, the first lateral dimension $X_2$ of the temperature adjusting component 111 is greater than the first lateral dimension $X_1$ of the second set of stacked semiconductor devices 105, whereas the second lateral dimension $Y_2$ of the temperature adjusting component 111 is generally the same as the second lateral dimension $Y_1$ of the second set of stacked semiconductor devices 105. In the embodiment illustrated in FIG. 2C, the first lateral dimension $X_2$ of the temperature adjusting component 111 is generally the same as the first lateral dimension $X_1$ of the second set of stacked semiconductor devices 105, and the second lateral dimension $Y_2$ of the temperature adjusting component 111 is also generally the same as the second lateral dimension $Y_1$ of the second set of stacked semiconductor devices 105.

Figure 3:
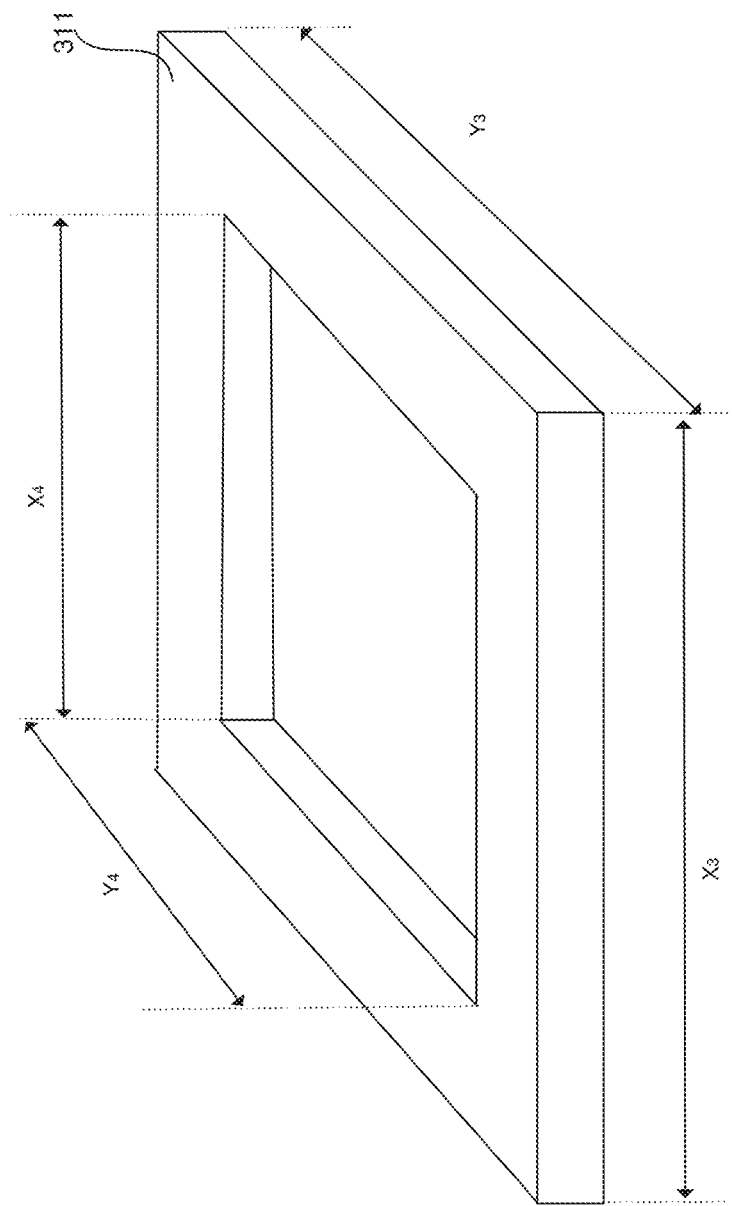
FIG. 3 is a schematic, isometric view of a temperature adjusting component in accordance with an embodiment of the present technology.

FIG. 3 is a schematic, isometric view of a temperature adjusting component 311 in accordance with an embodiment of the present technology. The temperature adjusting component 311 is a rectangular ring. As shown, the temperature adjusting component 311 has a first external dimension $X_3$ and a second external dimension $Y_3$. The temperature adjusting component 311 also has a first inner dimension $X_4$ and a second inner dimension $Y_4$. The first external dimension $X_3$ is greater than the first inner dimension $X_4$. The second external dimension $Y_3$ is greater than the second inner dimension $Y_4$. The difference between the first external dimension $X_3$ and the first inner dimension $X_4$ (or the difference between the second external dimension $Y_3$ and the second inner dimension $Y_4$) can vary in various embodiments depending on factors such as the dimension of the second set of stacked semiconductor devices 105, a target temperature for curing the curable layers 1033 of the first set of stacked semiconductor devices 103, types of materials of the curable layers 1033, 1053, a distance or gap between the first and second sets of semiconductor devices 103, 105, etc.

Figure 4A:
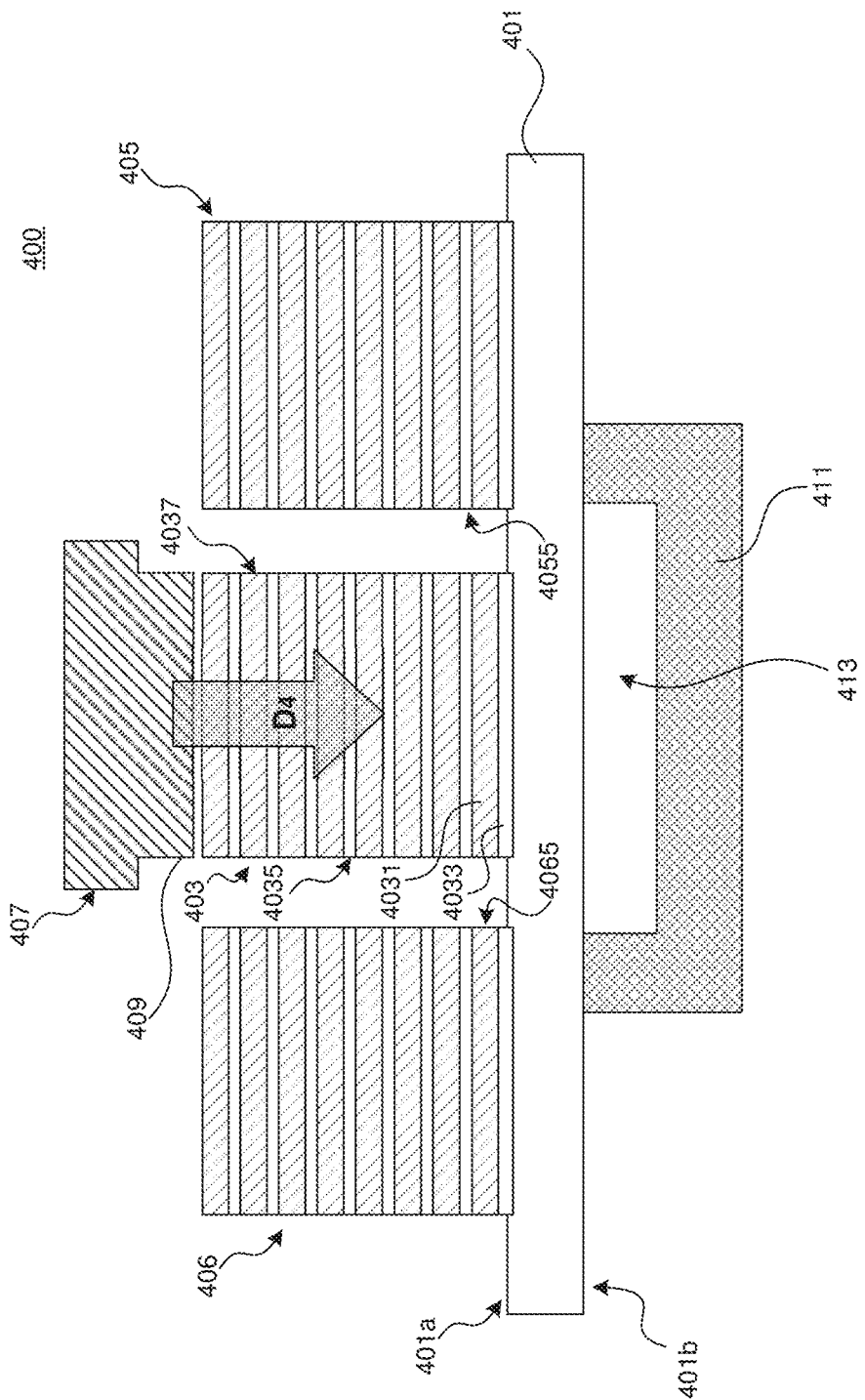
FIGS. 4A and 4B are schematic cross-sectional views of semiconductor device package assemblies in accordance with an embodiment of the present technology.

FIG. 4A is a schematic cross-sectional view of a semiconductor device assembly 400 in accordance with an embodiment of the present technology. The semiconductor device assembly 400 includes a base substrate 401, a first set of stacked semiconductor devices 403, a second set of stacked semiconductor devices 405, and a third set of stacked semiconductor devices 406. The second and third sets of stacked semiconductor devices 405 and 406 are on opposite sides of the first set of stacked semiconductor devices 403. The semiconductor device packages 403, 405, and 406 are attached to a front side 401a of the base substrate 401, and the base substrate 401 has a back side 401b. In some embodiments, the semiconductor device assembly 400 can include more than three semiconductor device packages.

As shown in FIG. 4A, a thermal component 409 of a bond head 407 is used heat the first set of stacked semiconductor devices 403 to bond the semiconductor devices 4031 in the first set of stacked semiconductor devices 403 together. The semiconductor devices 4031 can be bonded by curing films 4033 attached to the semiconductor devices 4031, respectively. The heat generated by the thermal component 409 flows toward the base substrate 401, as indicated by direction $D_4$.

The semiconductor device assembly 400 also has a cooling unit 411 attached to the back side 401b of the base substrate 401. The backside cooling unit 411 is configured to inhibit or prevent heat generated by the thermal component 409 from transferring to either the second set of stacked semiconductor devices 405 or the third set of stacked semiconductor devices 406 via the base substrate 401. In some embodiments, the backside cooling unit 411 can be formed with a recess 413, which can effectively prevent the backside cooling unit 411 from absorbing too much heat from the base substrate 401. This may be useful because absorbing too much heat may affect the curing process of curing the films 4033. By this arrangement, the curing process for the films 4033 (e.g., particularly the lowest one in FIG. 4) of the first set of stacked semiconductor devices 403 is not affected by the backside cooling unit 411.

In some embodiments, the backside cooling unit 411 can be shaped or formed according to the shape, materials, and/or characteristics of the base substrate 401. The dimensions of the recess 413, for example, can be determined based on the thermal conductivity of the base substrate 401 and the load provided by the thermal component 409. For example, in embodiments where the base substrate 401 has a relatively high thermal conductivity, the dimension of the recess 413 can be relatively small. Conversely, when the base substrate 401 has a relatively low thermal conductivity, the dimension of the recess 413 can be relatively large. As shown in FIG. 4A, the recess 413 can have a lateral dimension from a side surface 4055 of the second set of stacked semiconductor devices 405 to a side surface 4065 of the third set of stacked semiconductor devices 406. In some embodiments, the recess 413 can have a lateral dimension the same as the lateral dimension of the first set of stacked semiconductor devices 403 (e.g., from a first side surface 4035 to a second side surface 4037 opposite the first side surface 4035). In some embodiments, the recess 413 can have a lateral dimension somewhere between what is shown in FIG. 4A and the lateral dimension of the first set of stacked semiconductor devices 403.

Figure 4B:
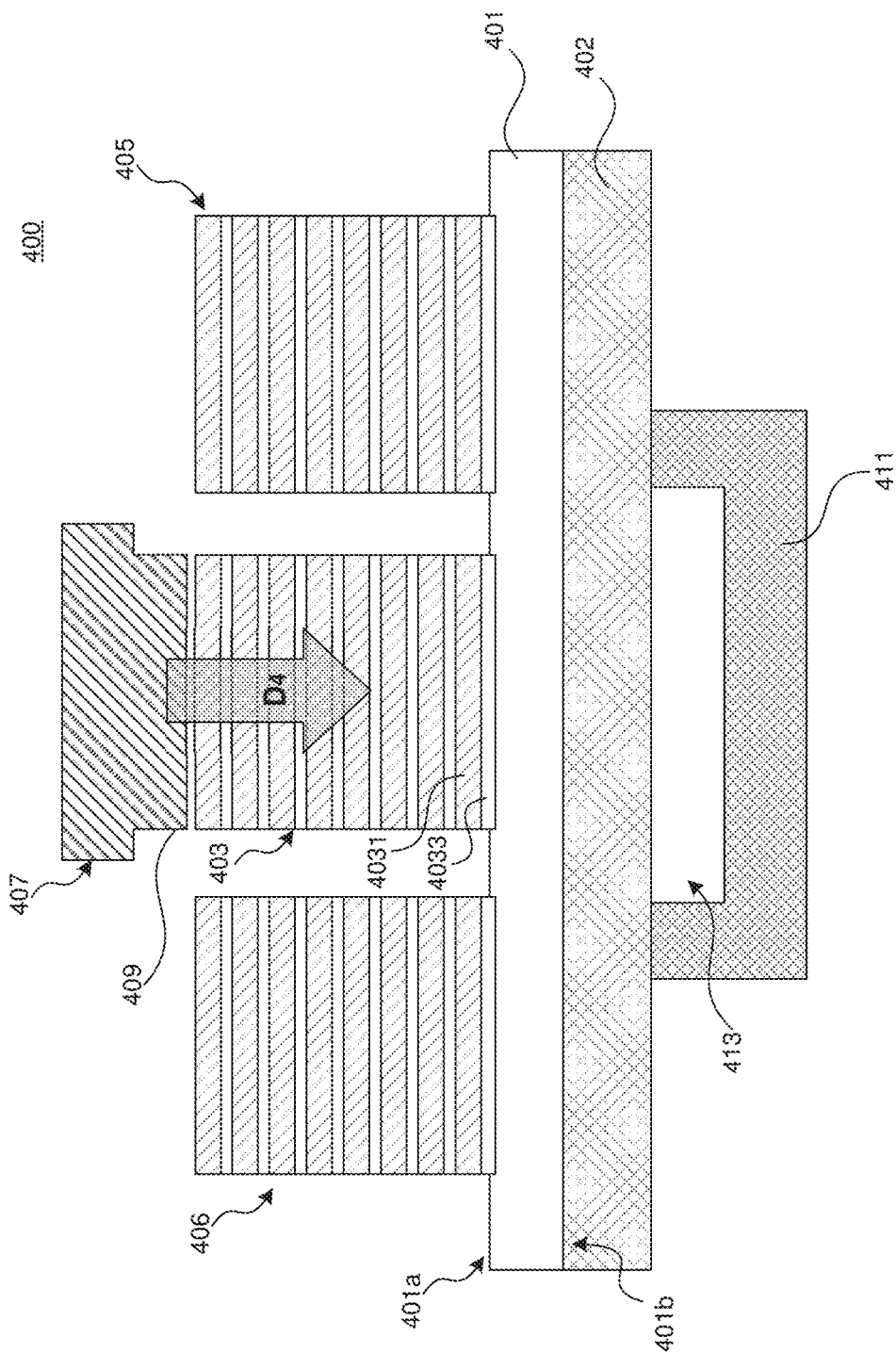

FIG. 4B shows another configuration in which the base substrate 401 in FIG. 4B is carried by a chuck table 402 and the backside cooling unit 411 is attached to the chuck table 402. The backside cooling unit 411 is accordingly not part of the semiconductor device assembly 400 (FIG. 4A), but instead is a feature of the chuck table 402. In such embodiments, the backside cooling unit 411 can absorb heat generated by the thermal component 409 and inhibit or otherwise prevent such heat from transferring to either the second set of stacked semiconductor devices 405 or the third set of stacked semiconductor devices 406 via the base substrate 401 and the chuck table 402.

FIG. 5 is a block diagram illustrating a system that incorporates a semiconductor assembly in accordance with an embodiment of the present technology. Any one of the semiconductor devices having the features described above with reference to FIGS. 1A-4B can be incorporated into any of a myriad of larger and/or more complex systems, a representative example of which is a system 500 shown schematically in FIG. 5. The system 500 can include a processor 501, a memory 503 (e.g., SRAM, DRAM, flash, and/or other memory devices), input/output devices 505, and/or other subsystems or components 507. The semiconductor assemblies, devices, and device packages described above with reference to FIGS. 1-4 can be included in any of the elements shown in FIG. 5. The resulting system 500 can be configured to perform any of a wide variety of suitable computing, processing, storage, sensing, imaging, and/or other functions. Accordingly, representative examples of the system 500 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 500 include lights, cameras, vehicles, etc. With regard to these and other examples, the system 500 can be housed in a single unit or distributed over multiple interconnected units, e.g., through a communication network. The components of the system 500 can accordingly include local and/or remote memory storage devices and any of a wide variety of suitable computer-readable media.

Figure 6:
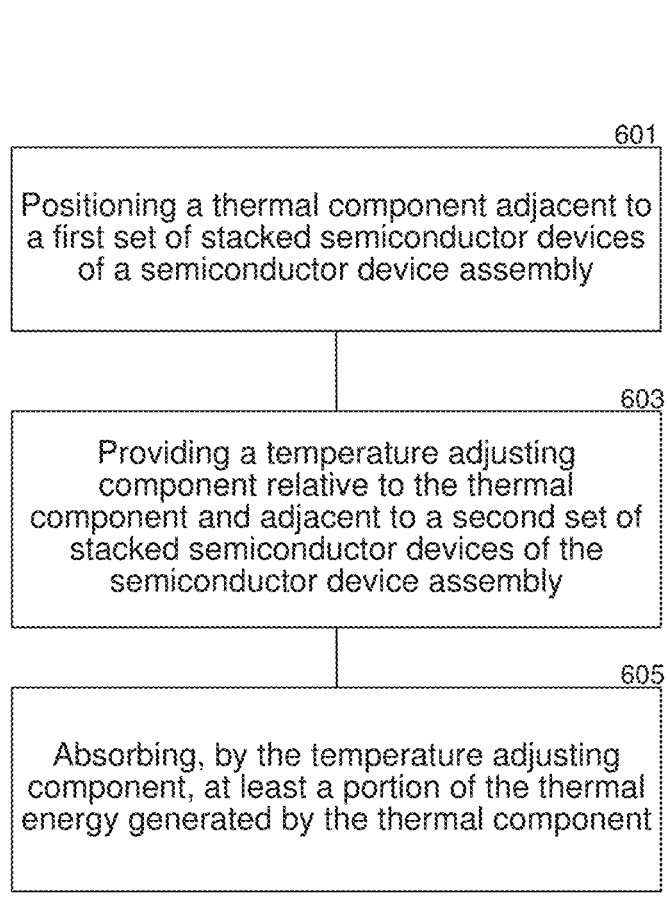
FIG. 6 is a flowchart illustrating a method in accordance with an embodiment of the present technology.

FIG. 6 is a flowchart illustrating a method 600 for managing thermal energy in a semiconductor device assembly in accordance with an embodiment of the present technology. The method 600 starts, at block 601, by positioning a thermal component adjacent to a first set of stacked semiconductor devices of the semiconductor device assembly. At block 603, the method 600 continues by providing a temperature adjusting component relative to the thermal component and adjacent to a second set of stacked semiconductor devices of the semiconductor device assembly. At block 605, the method 600 continues by absorbing at least a portion of the thermal energy generated by the thermal component via the temperature adjusting component such that the temperature of the second set of stacked semiconductor devices remains within a desired range (e.g., an increase of not more than 1 to 5 degree Celsius).

The method 600, for example, can include transferring at least a portion of the thermal energy generated by the thermal component to the first set of stacked semiconductor devices such that the temperature of the first set of stacked semiconductor devices is increased. In some embodiments, the method 600 includes measuring a temperature of the first and/or second set(s) of stacked semiconductor devices, and in response to a change of the measured temperature adjusting a temperature of the temperature adjusting component or a temperature of the thermal component. For example, reducing the thermal energy when the temperature of the first set of stacked semiconductor devices (e.g., 103 or 403) has been at a sufficient temperature for a sufficient time to cure the curable layers or films, or when the temperature of the first and/or second set(s) of stacked semiconductor devices exceeds a corresponding threshold temperature.

In some embodiments, a method for managing thermal energy in accordance with the present technology can include (1) applying thermal energy from a separate thermal component to a first set of stacked semiconductor devices of a semiconductor device assembly; and (2) absorbing, by a temperature adjusting component of the semiconductor device assembly, at least a portion of thermal energy generated by the thermal component. By this arrangement, the portion of thermal energy can be inhibited from increasing the temperature of the second set of stacked semiconductor devices. In other words, the second set of stacked semiconductor devices can be at least partially thermally isolated from the first set of stacked semiconductor devices. In some embodiments, the method can further include measuring a temperature of the first and/or second set(s) of stacked semiconductor devices. In some embodiments, the method can further include in response to a change of the measured temperature, adjusting the temperature of the temperature adjusting component. In some embodiments, the method can further include in response to a change of the measured temperature, adjusting the temperature of the thermal component.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

I claim:

1. A tool configured to bond a semiconductor device assembly, the semiconductor device assembly comprising:
    a substrate having a first side and a second side opposite the first side;
    a first set of stacked semiconductor devices at the first side of the substrate; and
    a second set of stacked semiconductor devices adjacent to the first set of stacked semiconductor devices;
    wherein the tool comprises a bond head configured to apply thermal energy to the first set of staked semiconductor devices from a side of the first set of stacked semiconductor devices opposite the substrate,
    wherein the tool further comprises a temperature adjusting component configured to contact the second side of the substrate in a region at least partially vertically aligned with the second set of stacked semiconductor devices but not to contact with the second side of the substrate in any region vertically aligned with the first set of stacked semiconductor devices, and
    wherein the temperature adjusting component is configured to absorb at least a portion of the thermal energy applied to the first set of stacked semiconductor devices and thereby inhibit the thermal energy from heating the second set of stacked semiconductor devices.

2. The tool configured to bond a semiconductor device assembly of claim 1, wherein the temperature adjusting component is positioned with respect to the first and second sets of stacked semiconductor devices to at least partially thermally isolate the second set of stacked semiconductor devices from the first set of stacked semiconductor devices.

3. The tool configured to bond a semiconductor device assembly of claim 1, wherein the temperature adjusting component has a recess.

4. The tool configured to bond a semiconductor device assembly of claim 3, wherein the recess is adjacent to the first set of stacked semiconductor devices.

5. The tool configured to bond a semiconductor device assembly of claim 1, wherein the temperature adjusting component is a ring.

6. The tool configured to bond a semiconductor device assembly of claim 1, wherein the first set of stacked semiconductor devices has a first lateral dimension, and wherein the temperature adjusting component has a second lateral dimension larger than the first lateral dimension.

7. The tool configured to bond a semiconductor device assembly of claim 1, wherein the temperature adjusting component has an edge, and wherein the second set of stacked semiconductor devices has a side, and wherein the edge of the temperature adjusting component is aligned with the side of the second set of stacked semiconductor devices.

8. The tool configured to bond a semiconductor device assembly of claim 1, wherein the first set of stacked semiconductor devices has a first side, and wherein the second set of stacked semiconductor devices has a second side, and wherein the first side and the second side define an area.

9. The tool configured to bond a semiconductor device assembly of claim 8, wherein the temperature adjusting component is in the area.

10. The tool configured to bond a semiconductor device assembly of claim 1, wherein the temperature adjusting component is an active cooling unit.

11. The tool configured to bond a semiconductor device assembly of claim 1, wherein the temperature adjusting component is a passive cooling unit.

12. The tool configured to bond a semiconductor device assembly of claim 1, wherein the temperature adjusting component has a rectangular ring shape.

13. The tool configured to bond a semiconductor device assembly of claim 1, wherein the temperature adjusting component is positioned to absorb the portion of the thermal energy.

14. A tool configured to bond a semiconductor device assembly, the semiconductor device assembly comprising:
   a substrate having a first side and a second side opposite the first side;
   a first set of stacked semiconductor devices at the first side of the substrate;
   a second set of stacked semiconductor devices adjacent to one side of the first set of stacked semiconductor devices; and
   a third set of stacked semiconductor devices adjacent to an opposite side of the first set of stacked semiconductor devices;
   wherein the tool comprises a bond head configured to apply thermal energy to the first set of staked semiconductor devices from a side of the first set of stacked semiconductor devices opposite the substrate, and
   wherein the tool further comprises a temperature adjusting component configured to contact the second side of the substrate in a region at least partially vertically aligned with the second set of stacked semiconductor devices but not to contact with the second side of the substrate in any region vertically aligned with the first set of stacked semiconductor devices, the temperature adjusting component configured to be positioned with respect to the second set of stacked semiconductor devices to absorb at least a portion of the thermal energy and thereby at least partially thermally isolate the second set of stacked semiconductor devices from the first set of stacked semiconductor devices.

15. The tool configured to bond a semiconductor device assembly of claim 14, wherein the temperature adjusting component has a recess and the recess is aligned with the first set of stacked semiconductor devices.

* * * * *